(12) United States Patent
Elliott et al.

(10) Patent No.: US 12,265,797 B2
(45) Date of Patent: *Apr. 1, 2025

(54) APPARATUS AND METHOD FOR PROCESSING FLOATING-POINT NUMBERS

(71) Applicant: Imagination Technologies Limited, Kings Langley (GB)

(72) Inventors: Sam Elliott, London (GB); Jonas Olof Gunnar Kallen, Hisings Backa (SE); Casper Van Benthem, Abbots Langley (GB)

(73) Assignee: Imagination Technologies Limited, Kings Langley (GB)

( * ) Notice: Subject to any disclaimer, the term of this patent is extended or adjusted under 35 U.S.C. 154(b) by 0 days.

This patent is subject to a terminal disclaimer.

(21) Appl. No.: 18/544,313

(22) Filed: Dec. 18, 2023

(65) Prior Publication Data

US 2024/0126507 A1 Apr. 18, 2024

Related U.S. Application Data

(63) Continuation of application No. 17/588,671, filed on Jan. 31, 2022, now Pat. No. 11,847,429, which is a
(Continued)

(30) Foreign Application Priority Data

Jul. 19, 2019 (GB) ..................................... 1910397

(51) Int. Cl.
*G06F 7/485* (2006.01)
*G06F 7/24* (2006.01)
(Continued)

(52) U.S. Cl.
CPC ................ *G06F 7/485* (2013.01); *G06F 7/24* (2013.01); *G06F 7/501* (2013.01); *H03K 19/20* (2013.01)

(58) Field of Classification Search
CPC . G06F 7/485; G06F 7/24; G06F 7/501; G06F 7/509; G06F 7/575; H03K 19/20
(Continued)

(56) References Cited

U.S. PATENT DOCUMENTS

| 4,941,120 A | 7/1990 | Brown et al. |
| 7,051,062 B2 * | 5/2006 | Jalfon ..................... G06F 7/509 |
| | | 708/709 |

(Continued)

FOREIGN PATENT DOCUMENTS

WO 2020/046546 A1 3/2020

OTHER PUBLICATIONS

Anandakumar et al., "Design and Optimized Implementation of Six-Operand Single-Precision Floating-Point Addition," 2011 Int'l Conference on Advancements in Information Technology, IPCSIT vol. 20 (2011), sections 1. 1 and 3.3.
(Continued)

*Primary Examiner* — Tan V Mai
(74) *Attorney, Agent, or Firm* — Potomac Law Group, PLLC; Vincent M DeLuca

(57) ABSTRACT

Adder circuits and associated methods for processing a set of at least three floating-point numbers to be added together include identifying, from among the at least three numbers, at least two numbers that have the same sign—that is, at least two numbers that are both positive or both negative. The identified at least two numbers are added together using one or more same-sign floating-point adders. A same-sign floating-point adder comprises circuitry configured to add together floating-point numbers having the same sign and does not include circuitry configured to add together numbers having different signs.

19 Claims, 8 Drawing Sheets

Related U.S. Application Data continuation of application No. 16/933,017, filed on Jul. 20, 2020, now Pat. No. 11,269,594.

(51) Int. Cl.
*G06F 7/501* (2006.01)
*H03K 19/20* (2006.01)

(58) Field of Classification Search
USPC .................................................. 708/490, 709
See application file for complete search history.

(56) References Cited

U.S. PATENT DOCUMENTS

| | | | |
|---|---|---|---|
| 8,185,570 | B2 | 5/2012 | Fukumura et al. |
| 8,645,449 | B1 | 2/2014 | Langhammer |
| 10,534,578 | B1 | 1/2020 | Narayanaswami |
| 2010/0146022 | A1 | 6/2010 | Swartzlander, Jr. et al. |
| 2014/0074903 | A1 | 3/2014 | Swartzlander, Jr. et al. |
| 2017/0109134 | A1 | 4/2017 | Van Benthem et al. |
| 2020/0065066 | A1 | 2/2020 | Kallen et al. |

OTHER PUBLICATIONS

Hartwig et al., "Multi-Operand Floating-Point Addition Utilizing Operand Sorting," IEEE Proceedings of the International Symposium on Circuits and Systems, vol. 4, 1992; pp. 1800-1803.

Liang et al., "Floating Point Unit Generation and Evaluation for FPGAs," Field Programmable Custom Computing Machines, 2003; pp. 185-194.

Saleh et al., "A Floating Point Fused Add-Subtract Unit," IEEE 51st Midwest Symposium on Circuits and Systems, 2008; pp. 519-522.

\* cited by examiner

APPARATUS AND METHOD FOR PROCESSING FLOATING-POINT NUMBERS

CROSS-REFERENCE TO RELATED APPLICATIONS AND CLAIM OF PRIORITY

This application is a continuation under 35 U.S.C. 120 of copending application Ser. No. 17/588,671 filed Jan. 31, 2022, now U.S. Pat. No. 11,847,429, which is a continuation of prior application Ser. No. 16/933,017 filed Jul. 20, 2020, now U.S. Pat. No. 11,269,594, which claims foreign priority under 35 U.S.C. 119 from United Kingdom Application No. 1910397.7 filed Jul. 19, 2019, the contents of which are incorporated by reference herein in their entirety.

BACKGROUND

Floating-point arithmetic is useful in a variety of applications, including but not limited to graphics, data processing, image processing, signal processing, control algorithms, scientific programming, and many more applications. Adding together floating-point numbers is one of the most fundamental operations in floating-point arithmetic, and it is ubiquitous across the various different applications and implementations.

Floating-point addition may be implemented in software, e.g. by executing suitable instructions on a general purpose processing unit. Alternatively, floating-point addition may be implemented in hardware, e.g. by configuring fixed-function circuitry appropriately. Generally, a software implementation allows for greater flexibility than a hardware implementation (e.g. in terms of changing the operation of the addition after design time, e.g. changing the number of numbers to be added together); whereas generally, a hardware implementation provides a more efficient operation (e.g. in terms of lower latency and lower power consumption) compared to a software implementation. Therefore, if the efficiency of the operation is deemed to be more important than flexibility (e.g. if a specific type of addition is known to be needed to be performed many times in a device where power consumption and latency are important, such as a battery-powered mobile device, e.g. a smart phone, tablet or laptop) then a hardware implementation may be more appropriate than a software implementation.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

When implementing any functionality (e.g. floating-point addition) in dedicated hardware, the size of the hardware is a consideration, particularly if the hardware is to be used in a device whose size is tightly constrained, e.g. in a mobile device. Therefore, when designing hardware for processing units, there is a trade-off to be made between: (i) power consumption, (ii) processing performance, and (iii) size (which may also be referred to as "semiconductor area" or "silicon area"). Improvements in one of these factors (e.g. reduced power consumption, increased processing performance or reduced silicon area) can be made but this may result in a worsening in one or both of the other factors (e.g. increased power consumption, reduced processing performance or increased silicon area). Adder circuits and associated methods for processing a set of at least three floating-point numbers to be added together are described herein which can provide an improvement in one or more of these factors without necessarily resulting in a worsening of the other factor(s). The method comprises identifying, from among the at least three numbers, at least two numbers that have the same sign—that is, at least two numbers that are both positive or both negative. The identified at least two numbers are added together using one or more same-sign floating-point adders. A same-sign floating-point adder comprises circuitry configured to add together floating-point numbers having the same sign and does not include circuitry configured to add together numbers having different signs.

According to an aspect there is provided a machine-implemented method of processing an input set comprising at least three floating-point numbers to be summed, the input set including one or more positive numbers and one or more negative numbers, the method comprising:
  receiving the at least three floating-point numbers of the input set;
  identifying at least two numbers in the input set that have the same sign; and
  adding together the identified at least two numbers using one or more same-sign floating-point adders, to produce one or more partial summation results,
  wherein the one or more same-sign floating-point adders are implemented in fixed function circuitry configured to add together floating-point numbers having the same sign, and wherein the one or more same-sign floating-point adders do not include circuitry configured to add together numbers having different signs.

The present inventors have recognised two things. Firstly, it is easier to add together floating-point numbers if it is known in advance that those numbers have the same sign. Secondly, in any set of three numbers there must be at least two numbers having the same sign (or, more generally, in any set of (2n) or (2n−1) numbers, there will be at least n numbers that have the same sign). This combined recognition can be exploited to simplify the process of adding together any set of at least three floating-point point numbers, by identifying and adding together the numbers having the same sign first.

Two numbers having the same sign may be added together using a 2:1 same-sign adder (i.e. a same-sign adder having two inputs and one output).

Three numbers having the same sign may be added together using two 2:1 same-sign adders, wherein the output of the first adder provides one of the inputs to the second adder. Alternatively, a single 3:1 same-sign adder (i.e. a same-sign adder having three inputs and one output) may be provided to add together three numbers having the same sign. Efficiently adding together three numbers having the same sign may be useful, for example, when it is desired to add together five numbers (having arbitrary signs), since in any set of five numbers there will be at least three numbers that share the same sign.

Where multiple same-sign floating-point adders are used to add together the identified numbers having the same sign, at least some of the adders may be arranged in series (that is, with the output of one or more adders providing the input to one or more other adders). The arrangement of adders in series may comprise a tree having a plurality of layers, wherein each layer of the tree has a number of inputs and produces a number of intermediate results that is smaller than the number of inputs, wherein the intermediate results are provided as inputs to the next layer.

Preferably, no mixed-sign adders are used to produce the one or more partial summation results.

The method may further comprise outputting the one or more partial summation results and each remaining number from the input set. Here a "remaining number" means a number other than the identified at least two numbers having the same sign.

The method may further comprise: adding together the one or more partial summation results and each remaining number from the input set, thereby calculating the sum of the input set, wherein said adding together the one or more partial summation results and each remaining number from the input set comprises using at least one mixed-sign floating-point adder implemented in fixed function circuitry configured to add together floating-point numbers having signs that are the same or different.

The method may further comprise: using a mixed-sign floating-point adder to add together a plurality of numbers derived from the input set, wherein at least one of the plurality of numbers is a partial summation result produced by a same-sign floating-point adder, thereby calculating the sum of the input set, wherein the mixed-sign floating-point adder is implemented in fixed function circuitry configured to add together floating-point numbers having signs that are the same or different.

The one or more same-sign floating-point adders may comprise a first array of same-sign floating-point adders and a second array of same-sign floating-point adders, wherein identifying the at least two numbers having the same sign comprises: evaluating at least a sign bit of each floating-point number of the input set; passing each floating-point number of the input set to a respective input of the first array only if the sign bit of that floating-point number is zero; and passing each floating-point number of the input set to a respective input of the second array only if the sign bit of that floating-point number is one, the method further comprising combining an output of the second array with an output of the first array.

The combining may comprise subtracting the output of the second array from the output of the first array using a floating-point subtractor (in particular, if the output of the second array is expressed as a positive number). Alternatively, the combining may comprise adding the output of the second array to the output of the first array (in particular, if the output of the second array is expressed as a negative number).

In this approach, positive numbers from the input set are added together in the first array and negative numbers from the input set are added together in the second array.

The first array may have a number of inputs that is equal to the number of floating-point numbers in the input set. The second array may have a number of inputs that is equal to the number of floating-point numbers in the input set.

The first array and the second array may be implemented by two different arrays. The two different arrays may operate concurrently.

The first array and the second array may be implemented by a single array, which is operated as the first array at a first time and is operated as the second array at a second, different time.

Identifying the at least two numbers having the same sign may comprise sorting the input set into positive numbers and negative numbers.

The one or more same-sign floating-point adders may comprise an array of same-sign floating-point adders, the array having a plurality of inputs, and wherein adding together the identified at least two numbers may comprise: passing some or all of the positive numbers to a respective first subset of the plurality of inputs; and passing some or all of the negative numbers to a respective second subset of the plurality of inputs, such that each same-sign floating-point adder in the array receives inputs that have the same sign.

Identifying the at least two numbers that have the same sign may comprise determining that more than two numbers have the same sign, and identifying, among the more than two numbers having the same sign, the at least two numbers that have the smallest absolute values.

According to another aspect, there is provided an adder circuit, configured to process an input set comprising at least three floating-point numbers to be summed, the input set including one or more positive numbers and one or more negative numbers, the circuit comprising:
- an input, configured to receive the at least three floating-point numbers of the input set;
- multiplexing logic, configured to identify at least two numbers in the input set that have the same sign; and
- one or more same-sign floating-point adders, configured to add together the identified at least two numbers, to produce one or more partial summation results,
- wherein the one or more same-sign floating-point adders are implemented in fixed function circuitry configured to add together floating-point numbers having the same sign, and wherein the one or more same-sign floating-point adders do not include circuitry configured to add together numbers having different signs.

The adder circuit may further comprise: a first output, configured to output the one or more partial summation results; and a second output, configured to output each remaining number from the input set, other than the identified at least two numbers having the same sign.

The adder circuit may further comprise at least one mixed-sign floating-point adder implemented in fixed function circuitry configured to add together floating-point numbers having signs that are the same or different, wherein a first input of said at least one mixed-sign floating-point adder is coupled to an output of the one or more same-sign floating-point adders, and a second input of said at least one mixed-sign floating-point adder is configured to receive at least one remaining number from the input set, other than the identified at least two numbers.

The adder circuit may further comprise at least one mixed-sign floating-point adder implemented in fixed function circuitry configured to add together floating-point numbers having signs that are the same or different, wherein the at least one mixed-sign floating-point adder is configured to add together a plurality of numbers derived from the input set, thereby calculating the sum of the input set, wherein at least one of the plurality of numbers is a partial summation result produced by a same-sign floating-point adder.

Also provided is a compound adder circuit, comprising a plurality of circuits as summarised herein (of the same type or different types, in any combination), wherein an output of one adder circuit is coupled to an input of another adder circuit.

In some examples, the one or more same-sign floating-point adders comprises a first array of same-sign floating-point adders and a second array of same-sign floating-point adders, wherein the multiplexing logic is configured to: evaluate at least a sign bit of each floating-point number of the input set; pass each floating-point number of the input set to a respective input of the first array only if the sign bit of that floating-point number is zero; and pass each floating-point number of the input set to a respective input of the second array only if the sign bit of that floating-point number is one, the adder circuit further comprising a floating-point subtractor or mixed-sign floating-point adder, configured to combine an output of the second array with an output of the first array. The combining may comprise subtracting or adding, as explained previously above.

Each of the first array and the second array may comprise a logarithmic tree of same-sign floating-point adders.

The first array and the second array may be two different physical arrays in hardware. In particular, the two arrays may be arranged to operate in parallel with one another.

The first array and the second array may be provided by a single physical array in hardware, wherein the multiplexing logic is configured to: pass floating-point numbers whose sign bit is zero to the single array in a first time interval; and pass floating-point numbers whose sign bit is one to the single array in a second, different time interval.

The multiplexing logic may be configured to sort the input set into positive numbers and negative numbers.

The one or more same-sign floating-point adders may comprise an array of same-sign floating-point adders, the array having a plurality of inputs, wherein the multiplexing logic comprises a rotating multiplexer, configured to align a boundary between the positive numbers and negative numbers with a boundary between two same-sign floating-point adders in the array, such that each same-sign floating-point adder in the array receives inputs that have the same sign.

Other circuits and associated methods are also disclosed, for processing two floating-point numbers to generate a sum of the two numbers and a difference of the two numbers. The method comprises calculating a sum of the absolute values of the two floating-point numbers, using a same-sign floating-point adder, to produce a first result. The method further comprises calculating a difference of the absolute values to produce a second result. The sum and the difference are generated based on the first result, the second result, and the sign of each floating-point number.

The inventors have recognised that calculating the sum and difference of two numbers always involves adding together two numbers having the same sign. Therefore, a same-sign floating-point adder can be used to advantage in this context as well.

According to one aspect, there is provided a machine-implemented method of processing an input set comprising two floating-point numbers, each floating-point number having a sign, to generate a sum and a difference of the two floating-point numbers, the method comprising:
  receiving the two floating-point numbers of the input set;
  calculating a sum of the absolute values of the two floating-point numbers, using a same-sign floating-point adder, to produce a first result;
  calculating a difference of the absolute values of the two floating-point numbers, using a floating-point subtractor, to produce a second result; and
  generating the sum of the two floating-point numbers and the difference of the two floating-point numbers based on: the first result, the second result, and the sign of each floating-point number,
  wherein the same-sign floating-point adder is implemented in fixed function circuitry configured to add together floating-point numbers having the same sign, and wherein the same-sign floating-point adder does not include circuitry configured to add together numbers having different signs.

Generating the sum of the two floating-point numbers and the difference of the two floating-point numbers may comprise: generating the sum of the two floating-point numbers from one of the first result and the second result; and generating the difference of the two floating-point numbers from the other of the first result and the second result.

Generating the sum of the two floating-point numbers and the difference of the two floating-point numbers may comprise correcting a sign of the first result and a sign of the second result based on the sign of each of the two floating-point numbers.

According to another aspect, there is provided a circuit configured to process an input set comprising two floating-point numbers, each floating-point number having a sign, to generate a sum and a difference of the two floating-point numbers, the circuit comprising:
  an input, configured to receive the two floating-point numbers of the input set;
  a same-sign floating-point adder, configured to calculate a sum of the absolute values of the two floating-point numbers, to produce a first result;
  a floating-point subtractor, configured to calculate a difference of the absolute values of the two floating-point numbers, to produce a second result; and
  multiplexing and sign-correction logic, configured to generate the sum of the two floating-point numbers and the difference of the two floating-point numbers based on: the first result, the second result, and the sign of each floating-point number,
  wherein the same-sign floating-point adder is implemented in fixed function circuitry configured to add together floating-point numbers having the same sign, and wherein the same-sign floating-point adder does not include circuitry configured to add together numbers having different signs.

The floating-point subtractor is preferably implemented in fixed function circuitry.

In some embodiments, the floating-point subtractor may be implemented by a mixed-sign floating-point adder.

The multiplexing and sign-correction logic may be configured to: generate the sum of the two floating-point numbers from one of the first result and the second result; and generate the difference of the two floating-point numbers from the other of the first result and the second result.

The multiplexing and sign-correction logic may be configured to correct a sign of the first result and a sign of the second result based on the sign of each of the two floating-point numbers.

Also provided is a processing system comprising one of the circuits summarised above. Also provided is a processing system configured to perform a method as summarised above. In some embodiments, the processing system may be a graphics processing system or an artificial intelligence accelerator system. Such systems may be embodied in hardware on an integrated circuit.

Also provided is a method of manufacturing, using an integrated circuit manufacturing system, a circuit as summarised above or a processing system as summarised above. The method of manufacturing may comprise: processing, using a layout processing system, a computer readable description of the circuit or processing system so as to generate a circuit layout description of an integrated circuit embodying the circuit or processing system; and manufacturing, using an integrated circuit generation system, the circuit or processing system according to the circuit layout description.

Also provided is an integrated circuit definition dataset that, when processed in an integrated circuit manufacturing system, configures the integrated circuit manufacturing system to manufacture a circuit or a processing system as summarised above. The integrated circuit definition dataset may be stored on a computer readable storage medium, preferably a non-transitory computer readable storage medium.

Also provided is a computer-implemented method of processing a computer-readable description of an integrated circuit to generate a representation of the integrated circuit, the method comprising: receiving the computer-readable description of the integrated circuit; identifying, in the computer-readable description of the integrated circuit, a description of one or more functional blocks for summing at least three floating-point numbers; and generating the representation of the integrated circuit, wherein said one or more functional blocks are represented, in the representation of the integrated circuit, as a representation of an adder circuit as summarised above.

Also provided is a computer-implemented method of processing a computer-readable description of an integrated circuit to generate a representation of the integrated circuit, the method comprising: receiving the computer-readable description of the integrated circuit; identifying, in the computer-readable description of the integrated circuit, a description of one or more functional blocks for calculating a sum and difference of two floating-point numbers; and generating the representation of the integrated circuit, wherein said one or more functional blocks are represented, in the representation of the integrated circuit, as a representation of a circuit as summarised above.

Also provided is computer program code configured to cause one or more processors to perform a computer-implemented method as summarised above when the code is run on the one or more processors. The computer program code may be stored on a non-transitory computer-readable storage medium.

Also provided is a computer readable description of a circuit or a processing system as summarised above, which, when processed in an integrated circuit manufacturing system, causes the integrated circuit manufacturing system to manufacture an integrated circuit embodying the circuit or processing system. The computer readable description may be stored on a computer readable storage medium, preferably a non-transitory computer readable storage medium.

Also disclosed is a non-transitory computer readable storage medium having stored thereon a computer readable description of a circuit or a processing system as summarised above, which, when processed in an integrated circuit manufacturing system, causes the integrated circuit manufacturing system to: process, using a layout processing system, the computer readable description so as to generate a circuit layout description of an integrated circuit embodying the circuit or processing system; and manufacture, using an integrated circuit generation system, the circuit or processing system according to the circuit layout description.

The above features may be combined as appropriate, as would be apparent to a skilled person, and may be combined with any of the aspects of the examples described herein.

BRIEF DESCRIPTION OF THE DRAWINGS

Examples will now be described in detail with reference to the accompanying drawings in which.

Figure 1:
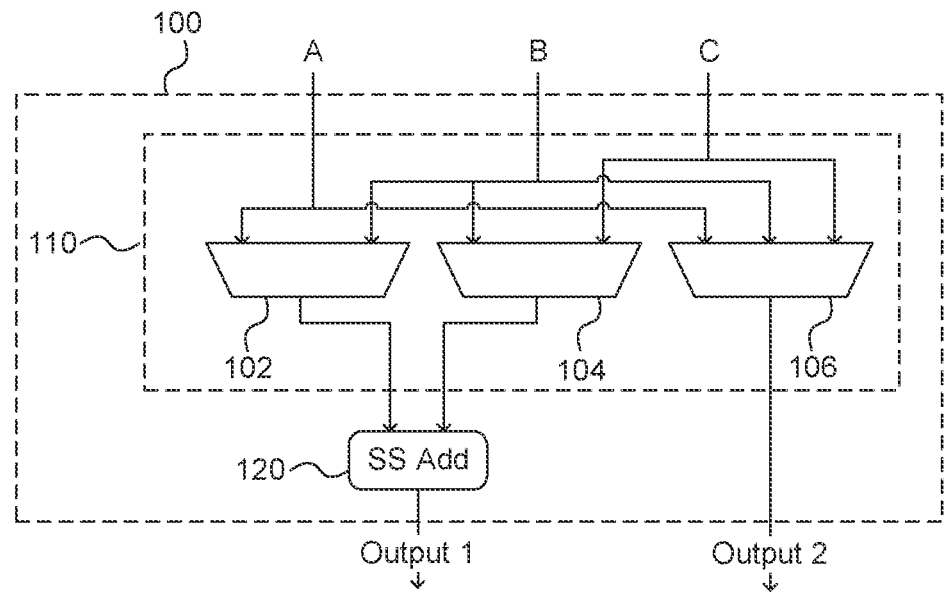
FIG. 1 is a schematic block diagram of an adder circuit according to a first embodiment.

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures, where appropriate, to indicate similar features.

DETAILED DESCRIPTION

In the description of the preferred embodiments below, the following terms are used: "Same-sign floating-point adder": a component that is only capable of adding together floating-point numbers having the same sign, and is not capable of adding together floating-point numbers that have different signs. To put this another way, a same-sign floating-point adder will, in general, give an incorrect result if it is presented with inputs having different signs (although there may be limited combinations of input-values for which it can still give the correct result). In the drawings, same-sign floating-point adders are denoted by the label "SS Add". In examples described herein, the same-sign floating-point adders are implemented in fixed function circuitry configured to add together floating-point numbers having the same sign, but the same-sign floating-point adders do not include circuitry configured to add together numbers having different signs.

"Mixed-sign floating-point adder": a component that is capable of adding together floating-point numbers having the same sign, and is capable of adding together floating-point numbers that have different signs. That is, a mixed-sign floating-point adder will give a correct result when presented with inputs having signs that are the same or different. In the drawings, mixed-sign floating-point adders are denoted by the label "Add" (since they are the conventional floating-point adder, capable of adding signed floating-point numbers). In examples described herein, the mixed-sign floating-point adders are implemented in fixed function circuitry configured to add together floating-point numbers having signs that are the same or different.

"Floating-point subtractor": a component that is capable of subtracting one floating-point number from another. In examples described herein, a floating-point subtractor is implemented in fixed function circuitry. In some examples, a floating-point subtractor may be implemented by a mixed-sign floating-point adder (since a mixed-sign floating-point adder is capable of both addition and subtraction).

The following description is presented by way of example to enable a person skilled in the art to make and use the invention. The present invention is not limited to the embodiments described herein and various modifications to the disclosed embodiments will be apparent to those skilled in the art.

Embodiments will now be described by way of example only.

FIG. 1 shows an adder circuit 100 according to a first embodiment. The adder circuit 100 is configured to process an input set consisting of three floating-point numbers A, B, and C, to be summed. It is assumed that the input set includes a mix of positive and negative numbers (although the adder circuit works just as well if the numbers are all positive or all negative). The adder circuit 100 comprises an input, configured to receive the numbers A, B, and C; multiplexing logic 110, configured to identify two numbers among the input set having the same sign; and a same-sign floating-point adder 120, configured to add together the identified two numbers having the same sign, thereby producing a partial summation result. In the embodiment of FIG. 1, the partial summation result is output via a first output ("Output 1") of the circuit. A second output ("Output 2") is configured to output the remaining number from the input set—that is, the third number other than the two identified numbers having the same sign. In this way, the adder circuit 100 of FIG. 1 acts as a "reductor", reducing three floating-point inputs that need to be summed, to two floating-point outputs that need to be summed. As will be discussed in more detail below, this reductor can be used as a building block to construct larger adder circuits.

The multiplexing logic 110 comprises three multiplexers 102, 104, and 106. The first multiplexer 102 has two inputs, configured to receive the numbers A and B, respectively. The second multiplexer 104 also has two inputs, configured to receive the numbers B and C, respectively. The third multiplexer 106 has three inputs, configured to receive the three numbers A, B, and C, respectively. Each multiplexer has one output. The output of the first multiplexer 102 is coupled to one input of the same-sign floating-point adder 120. The output of the second multiplexer 104 is coupled to the other input of the same-sign floating-point adder 120. The output of the third multiplexer 106 is coupled directly to the second output of the circuit 100.

When the numbers A and B have the same sign, the first multiplexer 102 is controlled to output A, and the second multiplexer 104 is controlled to output B. Thus, the same-sign floating-point adder 120 adds together A and B. When the numbers A and C have the same sign, the first multiplexer 102 is controlled to output A, and the second multiplexer 104 is controlled to output C. Thus, the same-sign floating-point adder 120 adds together A and C. Likewise, when the numbers B and C have the same sign, the first multiplexer 102 is controlled to output B, and the second multiplexer 104 is controlled to output C. Thus, the same-sign floating-point adder 120 adds together B and C. In each case, the third multiplexer 106 is controlled to output the third of the three numbers—that is, the remaining number, selected by neither the first multiplexer 102 nor the second multiplexer 104. For clarity and simplicity, the control logic for the multiplexers is not shown in FIG. 1. However, it is straightforward to implement, using simple logic operations on the sign bits of the three numbers A, B, and C.

According to one example, the multiplexers 102-106 may be controlled as follows. Let Sa, Sb, and Sc, be the sign bits of A, B, and C, respectively.

If (Sa XOR Sb), then second multiplexer 104 selects C
If (Sa XOR Sc) AND (Sa XOR Sb), then first multiplexer 102 selects B In other words, second multiplexer 104 selects C if the signs of A and B are different; otherwise, it selects B. First multiplexer 102 selects B if the signs of A and C are different AND the signs of A and B are different; otherwise it selects A. The control signals for the third multiplexer 106 may be generated from the control signals for the other two multiplexers. Alternatively, as explained in the following, they may be generated from Sa, Sb, and Sc. Assume that the third multiplexer 106 is implemented as two two-input multiplexers 106a and 106b.

If (Sb XOR Sc) multiplexer 106a selects B rather than A
If (Sa XOR Sb) multiplexer 106b selects the output of multiplexer 106a rather than C Note that the XOR term (Sa XOR Sb) is used three times, so a single XOR gate could be shared. A truth table for the control logic outlined above is provided below. Here, m102 and m104 are the control bits for the first and second multiplexers 102 and 104, respectively; m106a and m106b are the control bits for the multiplexers 106a and 106b forming the third multiplexer 106.

| Sa | Sb | Sc | m102 | m104 | m106a | m106b |
|----|----|----|------|------|-------|-------|
| 0 | 0 | 0 | 0 (A) | 0 (B) | X | 0 (C) |
| 0 | 0 | 1 | 0 (A) | 0 (B) | X | 0 (C) |
| 0 | 1 | 0 | 0 (A) | 1 (C) | 1 (B) | 1 (m106a) |
| 0 | 1 | 1 | 1 (B) | 1 (C) | 0 (A) | 1 (m106a) |
| 1 | 0 | 0 | 1 (B) | 1 (C) | 0 (A) | 1 (m106a) |
| 1 | 0 | 1 | 0 (A) | 1 (C) | 1 (B) | 1 (m106a) |
| 1 | 1 | 0 | 0 (A) | 0 (B) | X | 0 (C) |
| 1 | 1 | 1 | 0 (A) | 0 (B) | X | 0 (C) |

As mentioned above, there will always be at least two numbers having the same sign in any input set of three numbers. In some circumstances, all three numbers may coincidentally have the same sign. In this case, for the circuit of FIG. 1, it does not matter particularly which two numbers are provided to the same-sign floating-point adder 120. However, according to a modification of the first embodiment, the multiplexing logic may in this case select the two numbers having the smallest absolute values and provide these to the same-sign adder 120. This may be advantageous because floating-point precision may sometimes be increased by prioritising the addition of small numbers, rather than adding a small number to a large number. In some embodiments, the smallest two numbers may conveniently be identified by comparing the exponents of the three numbers. This approximation will identify the smallest two numbers correctly when the numbers have different exponents. It might not identify the two smallest numbers correctly when numbers have the same exponent, but this is not a significant deficiency—in this case, the numbers are of roughly the same order of magnitude, and the precision of the calculation should not be very sensitive to the order of the addition operations.

Figure 2:
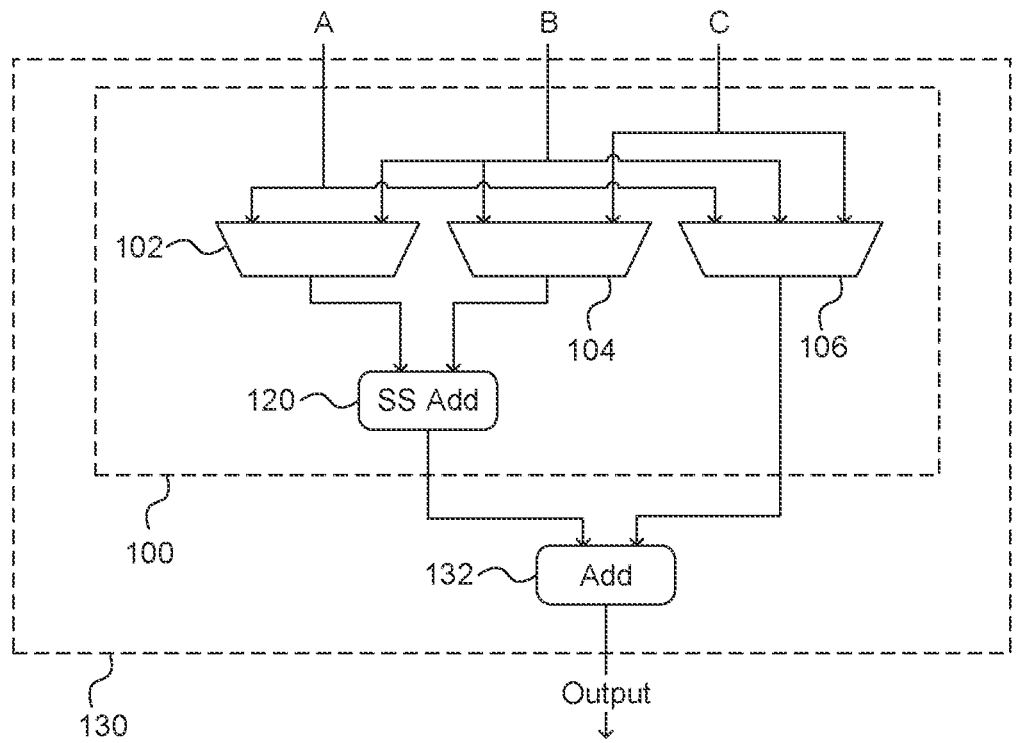
FIG. 2 is a schematic block diagram of an adder circuit according to a second embodiment, for adding together three floating-point numbers.

FIG. 2 shows an adder circuit 130 according to a second embodiment. It comprises the "reductor" adder circuit 100 of FIG. 1; and a mixed-sign floating-point adder 132. The inputs of the mixed-sign floating-point adder 132 are coupled to the outputs of the adder circuit 100 of the first embodiment. In this way, the adder circuit 130 of the second embodiment is configured to add together the three numbers A, B, and C, using one same-sign floating-point adder 120 and one mixed-sign floating-point adder 132. The mixed-sign floating-point adder 132 receives as inputs: (i) the partial summation result produced by the same-sign floating-point adder 120 and provided at the first output of the adder circuit 100; and (ii) the remaining number, provided at the second output of the adder circuit 100. The output of the mixed-sign floating-point adder 132 is provided as the output of the adder circuit 130 and represents the result of the sum of the input numbers (A, B and C).

A naïve approach to adding together the three numbers would use two mixed-sign floating-point adders with no multiplexing logic. A first of the mixed-sign floating-point adders would be arranged to add two of the input numbers (e.g. A and B). The second of the mixed-sign floating-point adders would be arranged to add together the remaining input number (e.g. C) and the result from the first mixed-sign floating-point adder to provide a result representing the sum of the three input numbers. Compared with this naïve approach, the adder circuit 130 of the second embodiment has replaced one of the mixed-sign floating-point adders with the adder circuit 100, which includes a same-sign floating-point adder 120 and some multiplexing logic 110. As described below, this same-sign floating-point adder 120 is susceptible to a simpler implementation (e.g. with reduced silicon area) than a mixed-sign floating-point adder 132, and therefore it can allow the addition of the three numbers to be implemented more efficiently (e.g. with reduced power consumption and/or reduced latency). For example, the inventors have found that the reduction in semiconductor-area achieved by using the same-sign floating-point adder 120 (rather than a mixed-sign floating-point adder) can significantly outweigh the additional area occupied by the multiplexing logic 110. Therefore, it can be considerably more efficient (e.g. in terms of silicon area, power consumption and/or latency) to use the adder circuit 130 of the second embodiment compared with a naïve adder circuit having two mixed-sign floating-point adders.

Figure 3:
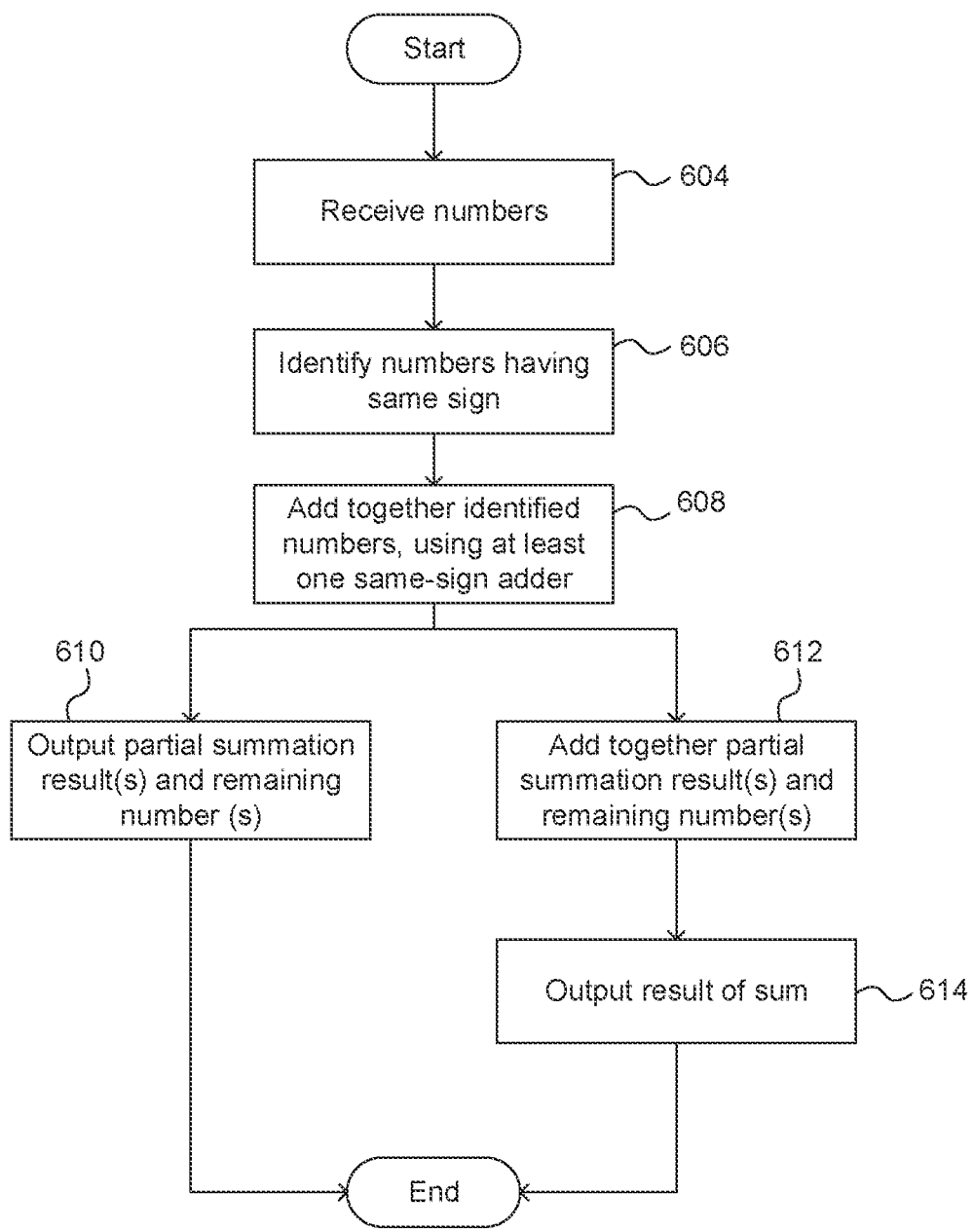
FIG. 3 is a flowchart illustrating a method according to an embodiment.

FIG. 3 is a flowchart of a method performed by an adder circuit according to an embodiment. In step 604 the adder circuit 100, 130 receives the three floating-point numbers A, B, and C of the input set. In step 606, the multiplexing logic 110 identifies two numbers in the input set having the same sign. In step 608, the same-sign floating-point adder 120 adds together the identified two numbers, to produce the partial summation result. In the "reductor" adder circuit 100 of FIG. 1, the partial summation result and the remaining one of the three numbers are output by the adder circuit 100 in step 610. In the adder circuit 130 of FIG. 2, in step 612, the mixed-sign floating-point adder 132 adds the partial summation result, generated by the same-sign floating-point adder 120, to the remaining number, thereby calculating the sum of the three input numbers A, B, and C. Following step 612, in step 614 the result of the sum of the three numbers A, B and C is output by the adder circuit 130.

As those skilled in the art will appreciate from the foregoing description, the scope of the present disclosure is not limited to adding together three floating-point numbers. The same principles can be extended to an arbitrarily large set of inputs. For example, the "reductor" adder circuit 100, and/or the adder circuit 130 may be implemented in a tree-like structure, with or without further mixed-sign adders, to give an improvement (e.g. reduced semiconductor area) over a similar circuit implemented using only mixed-sign adders. In the following discussion, a number of further examples will be provided of possible architectures for extending the principles to arbitrarily large sets of inputs.

Figure 4:
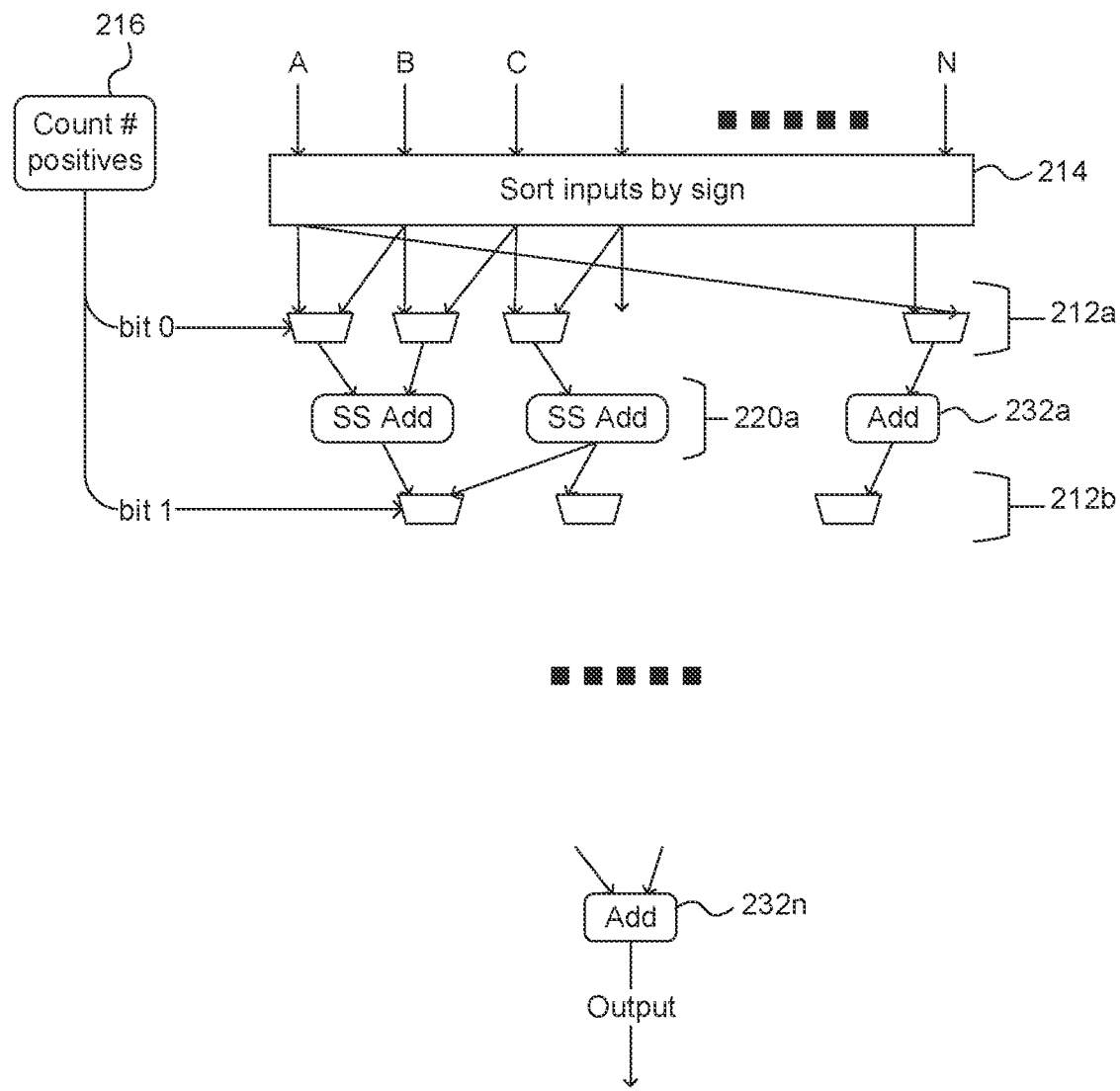
FIG. 4 is a schematic block diagram of an adder circuit according to a third embodiment, for adding together an arbitrary number of floating-point numbers.

FIG. 4 shows an architecture for adding together floating-point numbers according to a third embodiment. The adder circuit of this embodiment comprises an array of same-sign floating-point adders, arranged in a logarithmic tree. For simplicity and clarity, only the first layer 220a of same-sign adders in the tree is illustrated. The multiplexing logic comprises a sorting block 214, which is configured to sort the set of input numbers A, B, C, . . . N by sign, into positive numbers and negative numbers. The size (N) of the set can be arbitrarily large, in general. Within the subset of positive numbers, it is not necessary for the numbers to be sorted. Similarly, within the subset of negative numbers, it is not necessary for the numbers to be sorted. The sorting block 214 is configured to output a vector of numbers, with the positive numbers of the input set at one end of the vector and the negative numbers at the other end. The multiplexing logic further comprises a rotating multiplexer 212a, 212b, . . . formed by an array of individual multiplexers. These individual multiplexers are arranged in layers, with one layer 212a, 212b of multiplexers at the input to each layer 220a of same-sign floating-point adders in the tree. The multiplexers are configured to align a boundary between the positive numbers and negative numbers with a boundary between two same-sign floating-point adders in the array, such that each same-sign floating-point adder in the array always receives inputs that have the same sign. Referring to the first layer 212a of multiplexers, this can be achieved by either passing the sorted numbers straight through to the adders, or rotationally shifting the numbers one place to the left, depending on whether there is an odd or even number of positive numbers. This will ensure that there is at most one calculation at each layer of the tree that needs to operate on two floating-point numbers having different signs, and this calculation is in a predictable position to the right hand side of the tree. One mixed-sign floating-point adder 232a is provided in this position, to operate on the mixed sign numbers. The same procedure is repeated in successive layers of multiplexers and adders, until a final mixed-sign floating-point adder 232n is provided at the end of the tree. This mixed-sign adder 232n receives, at one of its inputs, the partial summation result output from the end of the array of same-sign floating point adders. At its other input, the mixed-sign adder receives the output of the mixed-sign adder in the preceding layer.

The control signals to control the circular shifting at each layer 212a, 212b of multiplexers can be generated by counting the number of positive (or respectively, negative) numbers in the input set. The multiplexing logic may therefore comprise a counting block 216, configured to count the number of positive (or negative) numbers. The count output provides the control bits, which can therefore be generated early, well before the calculation reaches the lower layers of the tree. The least significant bit of the count controls the multiplexers at the first layer 212a of the rotating multiplexer. The second least significant bit controls the multiplexers at the second layer 212b, and so on. In this way, the rotating multiplexer 212a, b, . . . ensures that there is at most one mixed-sign calculation at each layer, and this is performed by the mixed-sign floating-point adder to the right hand side of the tree at that layer.

As explained above, the architecture of FIG. 4 includes one mixed-sign floating-point adder at each layer. This is somewhat costly. It can be avoided by eliminating the mixed-sign floating-point adder from all but the final layer, and instead simply passing the mixed-sign numbers through to the next layer, until the final layer, where a single mixed-sign floating-point adder 232n is provided. In this case, in order to avoid the number of mixed sign numbers increasing at each layer, the multiplexing logic is preferably augmented to allow circular shifting of the numbers both one place to the left and one place to the right at each layer. By shifting left or right at each layer, as appropriate, this can ensure that there are at most two mixed sign numbers, which are always situated to the right hand side of the tree at each layer.

Figure 5:
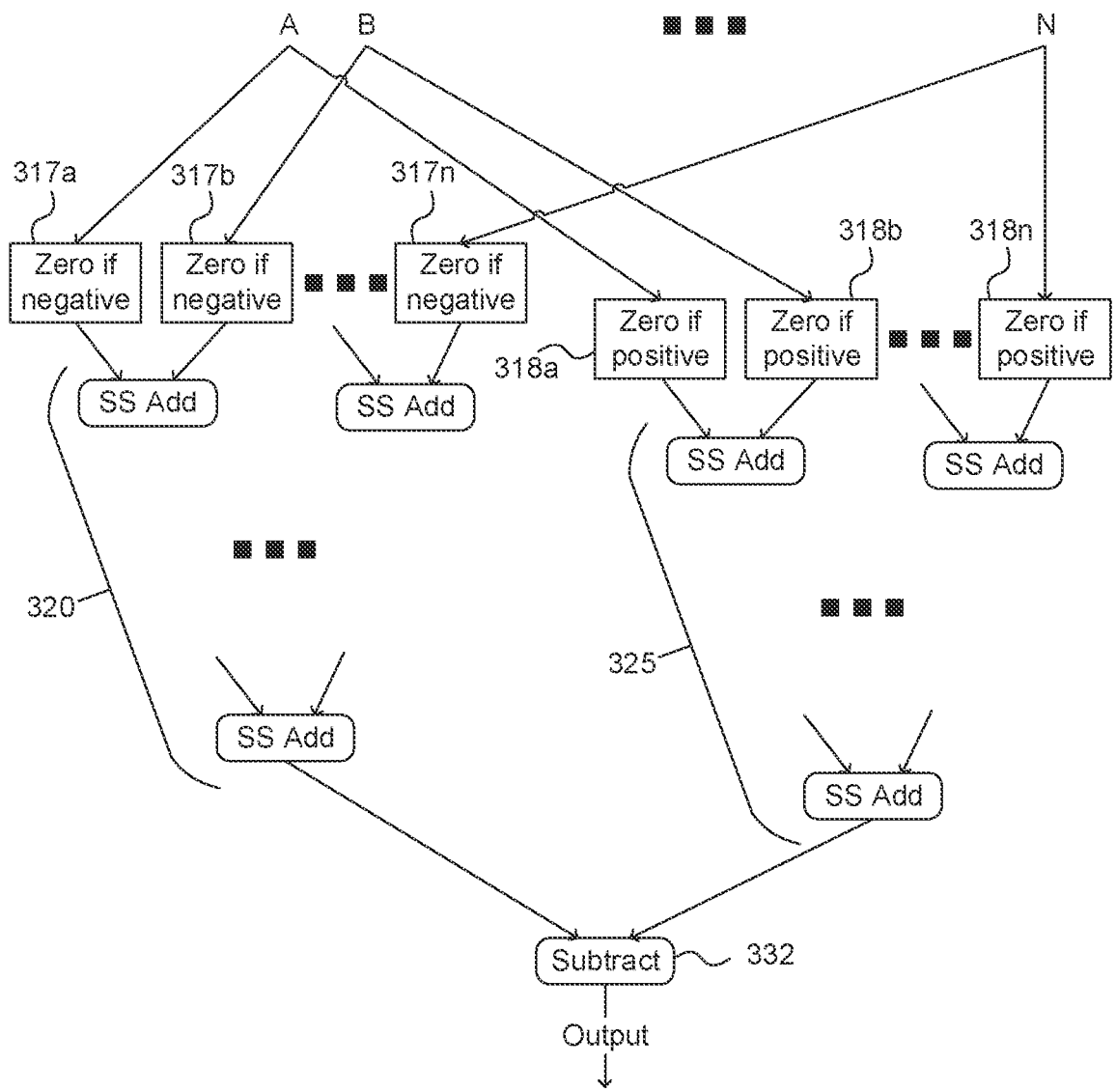
FIG. 5 is a schematic block diagram of an adder circuit according to a fourth embodiment, for adding together an arbitrary number of floating-point numbers.

It has been found that the sorting block 214 may be costly to implement. In some cases, the cost (in terms of semiconductor area) of implementing the sorting block 214 may outweigh the benefit of the reduced area occupied by the same-sign floating-point adders 220a. If the inputs are known to be pre-sorted for some reason (at least sorted into positive and negative subsets) then the sorting block 214 does not need to be included, which would make this embodiment less costly in terms of semiconductor area, power consumption and latency. It would be desirable to have an architecture that does not rely on sorting. FIG. 5 illustrates one such architecture.

FIG. 5 is a block diagram of an adder circuit according to a fourth embodiment. In this embodiment, the adder circuit comprises a first array 320 of same-sign floating-point adders and a second array 325 of same-sign floating-point adders. Multiplexing logic is provided in the form of blocks 317a-n and 318a-n. The circuit includes one block 317a-n and one block 318a-n for each input floating-point number. Each array 320, 325 has a number of inputs that is equal to the number of floating-point numbers (to be added together) in the input set. Thus, for each array, each input of the array corresponds to a respective floating-number in the input set. The blocks 317a-n control the inputs to the first array 320 while the blocks 318a-n control the inputs to the second array 325.

Each block 317 is configured to evaluate the sign bit of a respective floating-point number of the input set. If the sign bit is zero, the block 317 passes the number to the corresponding input of the first array 320. If the sign bit is one, the block 317 does not pass the number to the corresponding input of the array 320. In the embodiment of FIG. 5, the block 317 instead passes the floating-point number zero to the corresponding input of the array 320 when the sign bit is one. This means that the first array 320 receives all of the positive numbers in the input set, and receives floating-point values of zero in the positions corresponding to the negative numbers of the input set.

Each block 318 is configured to evaluate the sign bit of a respective floating-point number of the input set, and to do the opposite of block 317. That is, if the sign bit is one, the block 318 passes the number to the corresponding input of the second array 325. If the sign bit is zero, the block 318 does not pass the number to the corresponding input of the array 325. Instead, it passes the floating-point number zero to the corresponding input of the array 325 when the sign bit is zero. In this way, the second array 325 receives all of the negative numbers in the input set, and receives floating-point values of zero in the positions corresponding to the positive numbers of the input set.

The first array 320 comprises a logarithmic tree of same-sign floating-point adders. No additional multiplexing logic is required within this tree, because all of the inputs are positive or zero. Similarly, the second array 325 comprises a second logarithmic tree of same-sign floating-point adders, with no additional multiplexing logic, since all of the inputs are negative or zero. The adder circuit further comprises a floating-point subtractor 332. One input of the subtractor 332 is coupled to the output of the final same-sign floating-point adder in the first array 320. The other input of the subtractor 332 is coupled to the output of the final same-sign floating-point adder in the second array 325. The subtractor 332 is thus configured to combine the partial summation result produced by the first array with the partial summation result produced by the second array. In particular, the subtractor 332 is configured to subtract the absolute value of the sum of the negative numbers from the sum of the positive numbers. The subtractor 332 may be implemented by a mixed-sign floating-point adder, wherein adding a positive number and a negative number corresponds to subtracting the absolute value of the negative number from the positive number. Alternatively, since the subtractor 332 is always guaranteed to have one input that is positive (or zero) and one input that is negative (or zero), it may be optimised for this purpose.

It will be noted that the adder circuit of FIG. 5 requires a larger number of same-sign floating-point adders than the adder circuit of FIG. 4 (for the same size of the input set). However, surprisingly, it has been found that the area saved by eliminating the sorting block 214 of FIG. 4 can outweigh the additional area needed for the two arrays 320 and 325 in FIG. 5. Further optimisations of the architecture of FIG. 5 are also possible. For example, for any given input set, some of the adders in each array 320, 325 may have one input that is zero, and some adders may have zeros at both inputs. It may be beneficial to provide bypass circuitry to cater for these situations, to reduce power consumption. The addition of 0+0=0 can be avoided by detecting the zero inputs and bypassing the same-sign floating-point adder to supply an output of zero. Similarly, the addition of X+0=X can be avoided by detecting the zero input and bypassing the same-sign floating-point adder to supply an output of X. Of course, this optimisation saves energy but not semiconductor area, since the adders in each array still need to be implemented, for the cases in which their inputs are non-zero.

In FIG. 5 both arrays are the same size. In a variant of the embodiment of FIG. 5, it is possible for one array to be larger than the other. One such example comprises a first array that is the same size as the arrays in FIG. 5; and a second array that is half this size. That is, the first array has N inputs, while the second array has N/2 inputs (rounding up to the next integer when N is an odd number). This is based on the observation that in any set of (2n−1) or (2n) numbers, there must be at least n numbers that have the same sign. Rather than provide all the positive numbers to the first array (as in FIG. 5), in this variant the larger subset is provided to the first array and the smaller subset is provided to the second array. The worst case scenario for the first array is that all of the numbers have the same sign (whether all positive or all negative). In other words, in the worst case, the larger set contains the full set of input numbers This means that the first array needs to be "full" size, having N inputs. The worst case scenario for the second array is that the smaller set contains half of the input set of numbers. Consequently, the second array needs N/2 inputs. In this variant, some additional logic is needed to identify which subset of numbers is the larger set and which is the smaller set—that is, to identify whether there are more positive than negative numbers or vice versa. The cost of this additional logic can be traded off against the saving in area achieved by halving the size of the second array.

Because of the similarity between the two arrays 320 and 325 in the architecture of FIG. 5, there is an additional way to trade-off area against speed. In an alternative implementation of FIG. 5, the first array and the second array may be provided by a single array. The multiplexing logic is then configured to pass floating-point numbers whose sign bit is 0 to this single array in a first time interval (for example, a first clock-cycle) and to pass floating-point numbers whose sign bit is 1 to this single array in a second time interval (for example, a subsequent clock-cycle). The output of the array in the first interval (clock-cycle) can be stored in a register, so that the result generated in the second interval (clock-cycle) can subsequently be subtracted from it. (Naturally, the first and second time intervals need not be in that order—either the positive numbers or the negative numbers of the input set could be processed first.)

In examples like those of FIGS. 4 and 5, using one or more arrays or trees, it is not essential that the calculations propagate through the entire array or tree in a single clock cycle. Indeed, it may be beneficial to implement each array or tree as a pipeline, wherein the results generated by a given layer (or group of layers) in one clock cycle are stored in registers at the end of that clock cycle. In the next clock cycle, those results are read from the registers into the inputs of the next layer (or group of layers) in the array. In this way, one calculation follows another through the array, and the array can produce an output value in every clock cycle, even though it takes several clock cycles for the array to perform the whole calculation.

The pipelining concept can also be applied to the alternative implementation of FIG. 5, discussed above, in which the first and second arrays are provided by a single physical array. For example, a single pipelined array can be provided with positive numbers and negative numbers in alternate clock cycles, respectively. The calculations propagate through the single array in subsequent clock cycles until they reach the end of the array. The subtractor at the end of the array is controlled to recombine the positive and negative sums that originate from the same input set (according to whether the positive numbers or the negative numbers of the input set entered the pipeline first). In this way, a pipelined version of the single-array implementation of FIG. 5 can produce an output value every two clock cycles.

Figure 6:
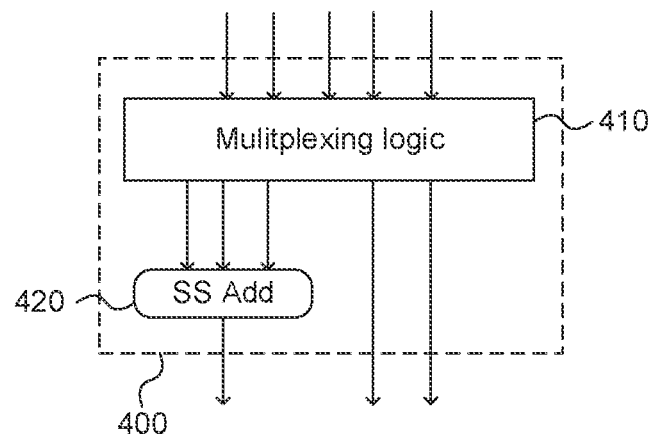
FIG. 6 is a schematic block diagram of an adder circuit according to another embodiment.

In the examples above, it was assumed that each same-sign floating-point adder is capable of adding together two inputs having the same sign, to generate one output. However, this is not essential. It is also possible to design a same-sign floating-point adder that adds together a larger number of inputs in an integrated fashion. FIG. 6 illustrates an adder circuit 400 built around a same-sign floating-point adder 420 that takes three floating-point inputs of the same sign, and adds them together to produce a single output. In FIG. 6, this is used as the basis for a 5:3 reductor, which takes five floating-point inputs to be summed and outputs three floating-point outputs. This works similarly to the 3:2 reductor of FIG. 1. Among the five floating-point inputs, multiplexing logic 410 selects three inputs that have the same sign. (There will always be at least three.) These three inputs are added together by the 3:1 same-sign floating-point adder 420. The remaining two inputs are passed through to the output of the reductor (adder circuit 400).

The three numbers provided at the output of the reductor (adder circuit 400) can subsequently be added together—for example, using the adder circuit 130 illustrated in FIG. 2, to provide a five input adder. This step is not essential.

The concept underlying the 3:2 reductor and 5:3 reductor can be generalised to a (2n−1):n reductor, since in any set of 2n−1 numbers there must be at least n numbers having the same sign. However, there is a trade-off, in that the multiplexing logic becomes more complicated (and occupies greater area) with larger numbers, n.

Figure 7:
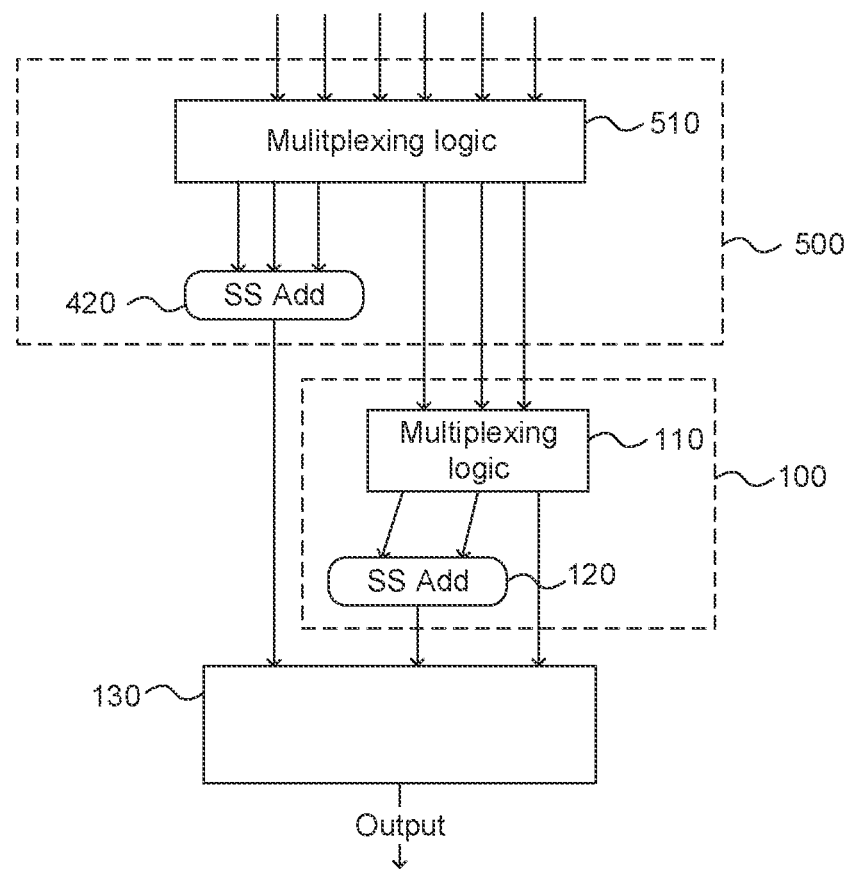
FIG. 7 is a schematic block diagram of a compound adder circuit, according to another embodiment, for adding together six floating-point numbers.

As mentioned previously above, adder circuits according to examples such as those described above can be combined into compound adder circuits. FIG. 7 shows an embodiment of one such compound adder circuit. This comprises a 6:4 reductor adder circuit 500; a 3:2 reductor adder circuit 100 as illustrated in FIG. 1; and an adder circuit 130 as illustrated in FIG. 2. The 6:4 reductor adder circuit 500 is similar to the 5:3 adder circuit 400 of FIG. 6. It is built around the same 3:1 same-sign floating-point adder 420, but the multiplexing logic 510 takes six inputs; passes three of them having the same sign to the adder 420; and passes the remaining three of them through to the output. These remaining three inputs passed through to the output of the circuit 500 are input to the multiplexing logic 110 of the circuit 100. This identifies two of them that have the same sign and inputs those to the same-sign floating-point adder 120. Note that the multiplexing logic blocks 510 and 110 can be implemented by a relatively simple, fast arrangement of logic gates. Therefore, in practice, the adder 120 can begin its calculation at the same time as—or shortly after, e.g. within the same clock cycle—the adder 420 begins its calculation. This may be advantageous for the overall latency of the circuit, and may therefore be preferable to other ways of connecting together the inputs and outputs of the various components circuits. In particular, it may be preferable when designing a pipelined implementation, since the goal in this case is generally to maximise the amount of computational work that can be done in each clock cycle by each stage of the pipeline. Nevertheless, this, connection configuration is not essential in all embodiments.

It will be noted that the 6:4 reductor adder circuit 500 is not an example of the (2n−1):n general principle mentioned above. However, it belongs to a closely related general class of reductor, in which (2n−1+m) inputs are reduced to (n+m) outputs, by building a (2n−1):n reductor and passing the additional m inputs through to the output.

Any of the circuits described above can be combined in hybrid configurations. For example, a partial array could be constructed, having a smaller number of layers than a full array and having a plurality of outputs. The outputs of the partial array could be provided as inputs into a compound circuit similar to that of FIG. 7. Likewise, a number of circuits like those of FIG. 6 or 7 could be constructed, wherein the outputs of these circuits are fed as inputs to an array like those of FIG. 4 or FIG. 5.

For completeness, the design of a same-sign floating-point adder will now be discussed, to illustrate how it can be simplified, making it more efficient in terms of silicon area, power consumption and latency, compared with a mixed-sign floating-point adder. The algorithm implemented by the same-sign floating-point adder proceeds as follows. To calculate Y, the sum of two floating-point numbers, A and B, having the same sign:

Identify A', the larger number. A'=max (A,B)
    Identify B', the smaller number. B'=min (A,B)
    Align the mantissa of B' with the mantissa of A'. This can be done by right-shifting the mantissa of B' by a number of bits equal to the difference between the exponent of A and the exponent of B.
    Add the bits of the two mantissas (as aligned) to produce Y', including an additional carry-bit c to the left. It will be understood that the carry-bit c is either 0 or 1. It is significant that this carry-bit, alone, encodes the change in magnitude of the output value Y with respect to the larger input value A'.

Set the mantissa of Y equal to Y'[M:1]] if the carry-bit c=1, or Y'[M−1:0] if there was no carry (carry bit c=0), where M is the number of mantissa bits to be included in the result Y.

Set the exponent of Y equal to the exponent of A' plus c.

Set the sign bit of Y equal to the sign bit of A (which is in any case the same as the sign bit of B).

This assumes an adder that truncates the result of the addition (that is, always rounds towards zero). If it is desired to produce the result by rounding to the nearest floating-point number, then some additional logic is needed to handle this. Further logic may be added for exception handling (NaN, inf, underflow, overflow, etc.).

Compared with a mixed-sign floating-point adder, the above algorithm eliminates several (potentially costly) operations. In a mixed-sign floating-point adder, firstly, two's-complement inversion will be required, to invert the mantissa of a negative input. Secondly, the difference between two numbers might be much smaller in magnitude than either of the two numbers themselves. This means that the magnitude of the result can be very different to the magnitude of the input numbers (unlike with a same-sign adder for which the exponent of the result is known to be either equal to, or one greater than, the exponent of the larger of the two input numbers) This necessitates, for a mixed-sign floating-point adder, a leading-zero count on Y', in order to determine the exponent of Y. And, thirdly, Y' needs to be left-shifted by a number of bits equal to the leading-zero count (a variable number of bits, which is not known in advance), to produce the mantissa of Y. By eliminating these operations, the same-sign floating-point adder can be significantly simpler (for example, substantially smaller in area) than a mixed-sign floating-point adder. For one exemplary implementation, based on 32-bit floating-point numbers and a clock period of 1 ns, the inventors have found that a same-sign floating-point adder can be approximately one third of the size of a mixed-sign floating-point adder, in terms of on-chip area.

Embodiments may be useful in any circumstances in which it is desired to add together three or more floating-point numbers. This need arises in many practical applications. It is a key step in inner product calculations, for example. The inner product (also known as the scalar product or dot product) of two vectors of numbers is produced by pairwise multiplying the corresponding elements from each vector and summing the results of these multiplications. Inner product calculations arise in applications including graphics and the implementation of neural networks. For example, graphics processing systems for rendering 3D scenes may often perform additions of three numbers (e.g. as part of a dot product between three-dimensional vectors), and as such an adder circuit may be included in a graphics processing system configured in fixed function circuitry specifically for adding three numbers together (e.g. using the adder circuit 130 shown in FIG. 2). As another example, a neural network accelerator may be configured to perform additions of large sets of numbers (e.g. 64, 128 or 256 numbers), e.g. as part of large weighted sums, and as such an adder circuit may be included in a neural network accelerator configured in fixed function circuitry specifically for adding together a particular number of numbers (e.g. 64, 128 or 256 numbers), e.g. using the adder circuit shown in FIG. 5 or a compound adder circuit similar to that shown in FIG. 7. Consequently, embodiments may find particular utility in a processing system such as a graphics processing system, or an artificial intelligence accelerator system (for example, comprising a neural network accelerator).

Figure 8:
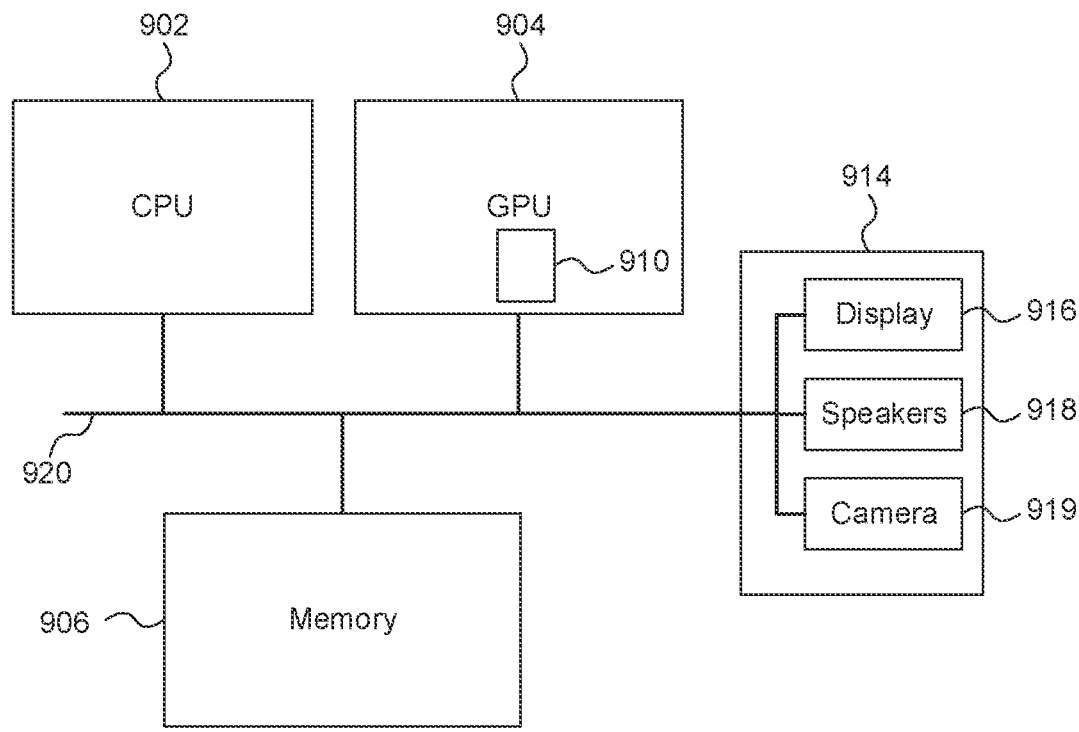
FIG. 8 shows a computer system in which a graphics processing system is implemented.

FIG. 8 shows a computer system in which such a graphics processing system may be implemented. The computer system comprises a CPU 902, a GPU 904, a memory 906 and other devices 914, such as a display 916, speakers 918 and a camera 919. A processing block 910 (corresponding to one of the adder circuits 100, 130, 400, 500 described above) is implemented on the GPU 904. The components of the computer system can communicate with each other via a communications bus 920.

While FIG. 8 illustrates the implementation of a graphics processing system, it will be understood that a similar block diagram could be drawn for an artificial intelligence accelerator system—for example, by replacing the GPU 904 with a Neural Network Accelerator (NNA), whereby the processing block 910 is implemented in the NNA.

The adder circuits of FIGS. 1, 2 and 4-7 are shown as comprising a number of functional blocks. This is schematic only and is not intended to define a strict division between different logic elements of such entities. Each functional block may be provided in any suitable manner. It is to be understood that intermediate values described herein as being formed by an adder circuit need not be physically generated by the adder circuit at any point and may merely represent logical values which conveniently describe the processing performed by the adder circuit between its input and output.

The adder circuits described herein are embodied in hardware on an integrated circuit. The adder circuits described herein may be configured to perform any of the methods described herein. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, byte-code, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be any kind of general purpose or dedicated processor, such as a CPU, GPU, NNA, System-on-chip, state machine, media processor, an application-specific integrated circuit (ASIC), or the like. A computer or computer system may comprise one or more processors.

The term "computer readable description of a circuit" is intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed (i.e. run) in an integrated circuit manufacturing system configures the system to manufacture an adder circuit configured to perform any of the methods described herein, or to manufacture an adder circuit comprising any apparatus described herein. An integrated circuit definition dataset may be, for example, an integrated circuit description.

Therefore, there may be provided a method of manufacturing, at an integrated circuit manufacturing system, an adder circuit as described herein. Furthermore, there may be provided an integrated circuit definition dataset that, when processed in an integrated circuit manufacturing system, causes the method of manufacturing an adder circuit to be performed.

An integrated circuit definition dataset may be in the form of computer code, for example as a netlist, code for configuring a programmable chip, as a hardware description language defining hardware suitable for manufacture in an integrated circuit at any level, including as register transfer level (RTL) code, as high-level circuit representations such as Verilog or VHDL, and as low-level circuit representations such as OASIS® and GDSII. Higher level representations which logically define hardware suitable for manufacture in an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture an adder circuit will now be described with respect to FIG. 9.

Figure 9:
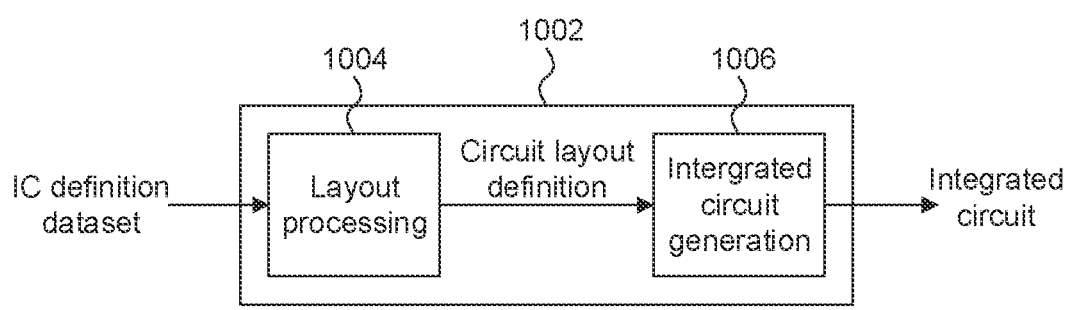
FIG. 9 shows an integrated circuit manufacturing system for generating an integrated circuit embodying a graphics processing system.

FIG. 9 shows an example of an integrated circuit (IC) manufacturing system 1002 which is configured to manufacture an adder circuit as described in any of the examples herein. In particular, the IC manufacturing system 1002 comprises a layout processing system 1004 and an integrated circuit generation system 1006. The IC manufacturing system 1002 is configured to receive an IC definition dataset (e.g. defining an adder circuit as described in any of the examples herein), process the IC definition dataset, and generate an IC according to the IC definition dataset (e.g. which embodies an adder circuit as described in any of the examples herein). The processing of the IC definition dataset configures the IC manufacturing system 1002 to manufacture an integrated circuit embodying an adder circuit as described in any of the examples herein.

The layout processing system 1004 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 1004 has determined the circuit layout it may output a circuit layout definition to the IC generation system 1006. A circuit layout definition may be, for example, a circuit layout description.

The IC generation system 1006 generates an IC according to the circuit layout definition, as is known in the art. For example, the IC generation system 1006 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 1006 may be in the form of computer-readable code which the IC generation system 1006 can use to form a suitable mask for use in generating an IC.

The different processes performed by the IC manufacturing system 1002 may be implemented all in one location, e.g. by one party. Alternatively, the IC manufacturing system 1002 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture an adder circuit without the IC definition dataset being processed so as to determine a circuit layout.

In some embodiments, an integrated circuit definition dataset, when processed in an integrated circuit manufacturing system, may cause an integrated circuit manufacturing system to generate a device as described herein. For example, the configuration of an integrated circuit manufacturing system in the manner described above with respect to FIG. 9 by an integrated circuit definition dataset may cause a device as described herein to be manufactured.

In some examples, an integrated circuit definition dataset could include software which runs on hardware defined at the dataset or in combination with hardware defined at the dataset. In the example shown in FIG. 9, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

Figure 10:
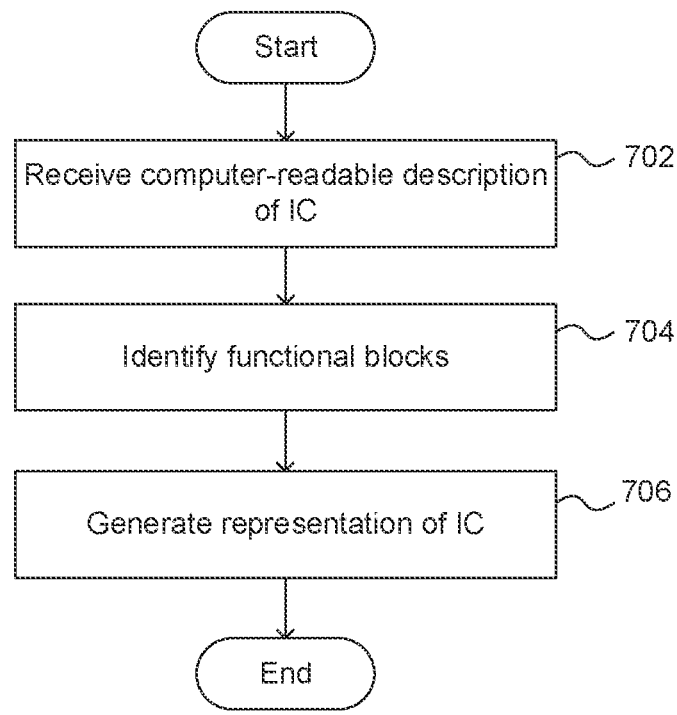
FIG. 10 is a flowchart illustrating a method of processing a computer-readable description of an integrated circuit to generate a representation of the integrated circuit.

FIG. 10 shows an example of a computer-implemented method of processing a computer-readable description of an integrated circuit, to generate a representation of the integrated circuit. This method may be performed by a synthesis tool, which synthesises RTL code to determine a gate level representation of a circuit to be generated, e.g. in terms of logical components (e.g. NAND, NOR, AND, OR, MUX and FLIP-FLOP components). In this synthesis process, the synthesis tool may optimise the circuit, by implementing a sum of floating-point numbers using an adder circuit like one of those described above, or implementing a sum and difference of floating point numbers using a circuit like the one described below, with reference to FIGS. 11 and 12. In step 702, the synthesis tool receives the computer-readable description of the integrated circuit. The computer-readable description may comprise RTL code. In step 704, the synthesis tool identifies, in the RTL code, a description of one or more functional blocks for summing three (or more) floating-point numbers, or for calculating a sum and difference of two floating-point numbers. In step 706, the synthesis tool generates the representation of the integrated circuit. The synthesis tool optimises the representation by representing the identified functional blocks as a representation of a circuit as described herein. The synthesis tool may select which type of circuit to use based on factors such as the number of inputs and outputs of the identified functional blocks, and/or design parameters to be prioritised (for example, speed or area). The generated representation of the integrated circuit may comprise a netlist—that is, a gate-level representation. This gate-level representation may be processed further in a subsequent step to generate a circuit layout.

Figure 11:
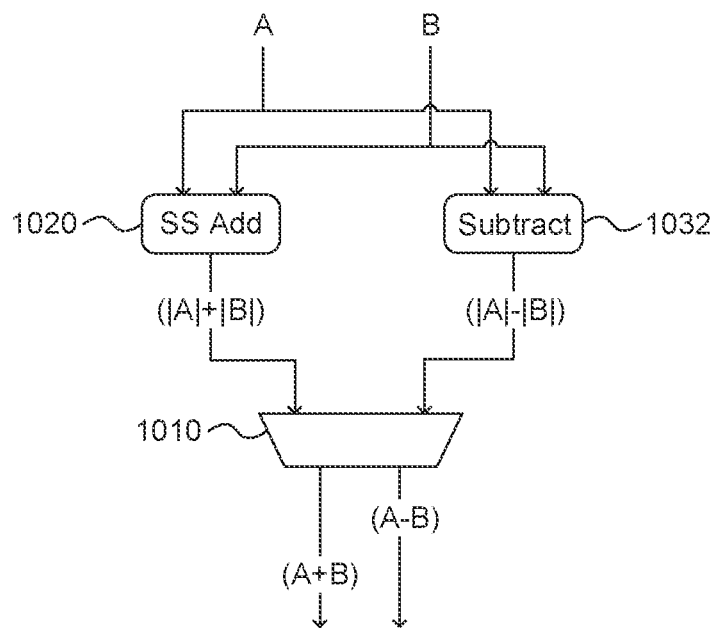
FIG. 11 is a schematic block diagram of a circuit for calculating a sum and difference of two floating-point numbers, according to an embodiment.

FIG. 11 shows a circuit configured to calculate the sum and difference of two floating-point numbers A and B. That is, the circuit of FIG. 11 is configured to calculate A+B and A−B. Irrespective of the signs of A and B, one of these calculations can be performed by a same-sign floating-point adder as described above. The other of the calculations requires a subtractor or mixed-sign floating-point adder. In the example of FIG. 11, the circuit comprises: a same-sign floating-point adder 1020; a floating-point subtractor 1032; and multiplexing and sign-correction logic 1010. Each of the adder 1020 and the subtractor 1032 is implemented in fixed function circuitry. Each of the adder 1020 and the subtractor 1032 has two inputs. The numbers A and B are provided to the respective inputs of both the adder 1020 and the subtractor 1032. The same-sign floating-point adder 1020 is configured to calculate the sum (|A|+|B|) of the absolute values of the two numbers, to produce a first result. As an example, it can do this by forcing the sign-bit of both numbers to zero (denoting a positive number), and adding together the resulting two positive numbers. In alternative examples the same-sign floating-point adder 1020 could ignore the sign bits of the two numbers or it could force both sign bits to one (denoting negative numbers), and then add together the resulting two numbers. The subtractor 1032 is configured to calculate the difference (|A|−|B|) of the absolute values of the two floating-point numbers, to produce a second result. As an example, it can do this by forcing the sign-bit of A to zero (denoting a positive number), and forcing the sign-bit of B to one (denoting a negative number). In an alternative example, the subtractor 1032 could force the sign-bit of A to one (denoting a negative number) and force the sign-bit of B to zero (denoting a positive number). The output of the same-sign floating-point adder 1020 and the output of the subtractor 1032 are provided as inputs to the multiplexing and sign-correction logic 1010. The multiplexing and sign-correction logic 1010 is configured to generate the sum (A+B) of the two floating-point numbers and the difference (A−B) of the two floating-point numbers based on: the first result, the second result, and the sign of each floating-point number A, B.

Figure 12:
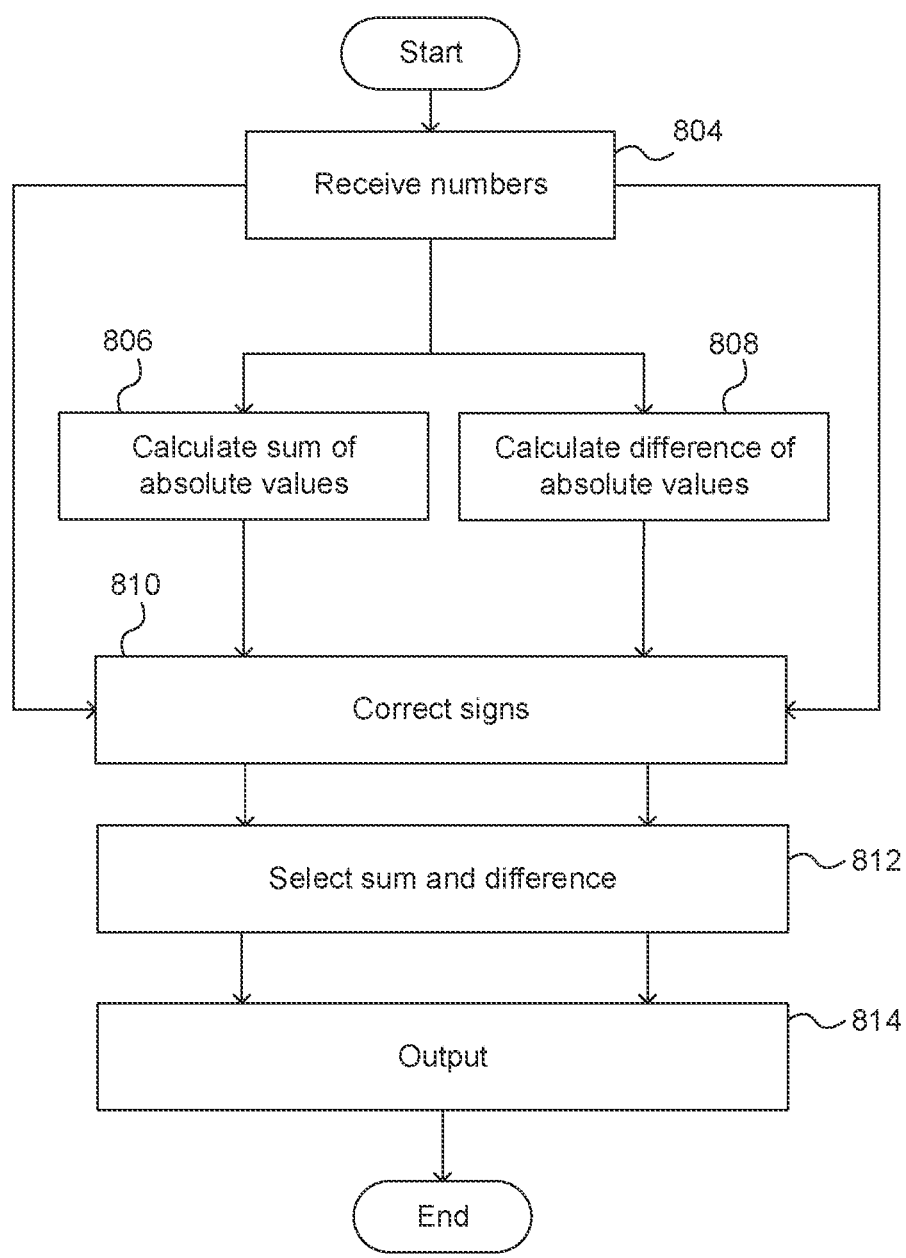
FIG. 12 is a flowchart of a method that can be performed by the circuit of FIG. 11, according to one embodiment.

FIG. 12 illustrates a method that may be performed by the circuit of FIG. 11. In step 804, the circuit receives the floating-point numbers A and B. In step 806, the same-sign floating-point adder 1020 calculates the sum of the absolute values of A and B, producing the first result. In step 808, the subtractor 1032 calculates the difference of the absolute values of A and B, producing the second result. In step 810, the multiplexing and sign-correction logic 1010 corrects the sign of the first result and the sign of the second result, according to the sign of each of the two floating-point numbers A and B. In step 812, the multiplexing and sign-correction logic 1010 selects one of the (sign-corrected) first result and the (sign-corrected) second result to generate the sum (A+B) of the two floating-point numbers. In the same step, the multiplexing and sign-correction logic 1010 selects the other of the (sign-corrected) results to generate the difference (A−B) of the two floating-point numbers. Finally, in step 814, the sum and difference values are output from the circuit.

A truth table for the operations performed by the multiplexing and sign-correction logic 1010, according to the present example, is provided below. In this table Sa denotes the sign-bit of the first number A and Sb denotes the sign-bit of the second number. The two right-hand columns indicate which result is selected to produce the relevant output of the circuit, and how the sign correction is performed.

| Sa | Sb | A + B | A − B |
| --- | --- | --- | --- |
| 0 | 0 | Select $1^{st}$ result, No sign-correction | Select $2^{nd}$ result, No sign-correction |
| 0 | 1 | Select $2^{nd}$ result, No sign-correction | Select $1^{st}$ result, No sign-correction |
| 1 | 0 | Select $2^{nd}$ result, Change sign | Select $1^{st}$ result, Change sign to 1 |
| 1 | 1 | Select $1^{st}$ result, Change sign to 1 | Select $2^{nd}$ result, Change sign |

For example, referring to the third row of the table, when A is negative and B is positive, the sum A+B of the two floating point numbers is given by −(|A|−|B|); therefore, the multiplexing and sign-correction logic 1010 selects the second result (|A|−|B|) and flips the sign-bit (to zero, if it was one; and to one, if it was zero). Meanwhile, the difference A−B of the two numbers is given by −(|A|+|B|); therefore, the multiplexing and sign-correction logic 1010 selects the first result (|A|+|B|) and flips the sign-bit. This changes the sign bit to one (since the first result is always positive, having a sign-bit equal to zero).

The subtractor 1032 may be implemented as a mixed-sign floating-point adder, since this is capable of subtracting floating point numbers. Alternatively, since it is known in advance that the first input A of the subtractor will always have its sign-bit forced to zero, and the second input B of the subtractor will always have its sign-bit forced to one, the subtractor can be simplified. (Two's complement inversion will always be performed on the second input B and will never be performed on the first input A.)

In the example described above, with reference to FIG. 12, the signs of the first result and the second result were corrected in step 810, before the selection of the outputs in step 812. However, as those skilled in the art will appreciate, the selection and sign-correction could equally be performed in the opposite order.

The implementation of concepts set forth in this application in devices, apparatus, modules, and/or systems (as well as in methods implemented herein) may give rise to performance improvements when compared with known implementations. The performance improvements may include one or more of increased computational performance, reduced latency, increased throughput, and/or reduced power consumption. During manufacture of such devices, apparatus, modules, and systems (e.g. in integrated circuits) performance improvements can be traded-off against the physical implementation, thereby improving the method of manufacture.

For example, a performance improvement may be traded against layout area, thereby matching the performance of a known implementation but using less silicon. This may be done, for example, by reusing functional blocks in a serialised fashion or sharing functional blocks between elements of the devices, apparatus, modules and/or systems. Conversely, concepts set forth in this application that give rise to improvements in the physical implementation of the devices, apparatus, modules, and systems (such as reduced silicon area) may be traded for improved performance. This may be done, for example, by manufacturing multiple instances of a module within a predefined area budget.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

What is claimed is:

1. An adder circuit, configured to process at least three floating-point numbers (A, B, C, . . . N) to be summed, the at least three floating-point numbers including one or more positive numbers and one or more negative numbers, the circuit comprising:
   multiplexing logic, configured to identify at least two numbers of the at least three floating-point numbers that have the same sign; and
   one or more same-sign floating-point adders, configured to add together the identified at least two numbers, to produce one or more partial summation results.

2. The adder circuit of claim 1, further comprising:
   a first output, configured to output the one or more partial summation results; and
   a second output, configured to output each remaining number from the at least three floating-point numbers, other than the identified at least two numbers having the same sign.

3. The adder circuit of claim 1, further comprising at least one mixed-sign floating-point adder implemented in fixed function circuitry configured to add together floating-point numbers having signs that are the same or different,
   wherein a first input of said at least one mixed-sign floating-point adder is coupled to an output of the one or more same-sign floating-point adders,
   and a second input of said at least one mixed-sign floating-point adder is configured to receive at least one number from the at least three floating-point numbers, other than the identified at least two numbers.

4. The adder circuit of claim 1, further comprising at least one mixed-sign floating-point adder implemented in fixed function circuitry configured to add together floating-point numbers having signs that are the same or different,
   wherein the at least one mixed-sign floating-point adder is configured to add together a plurality of numbers derived from the at least three floating-point numbers, thereby calculating the sum of the at least three floating-point numbers, wherein at least one of the plurality of numbers is a partial summation result produced by a same-sign floating-point adder.

5. The adder circuit of claim 1, wherein the one or more same-sign floating-point adders comprises a first array of same-sign floating-point adders and a second array of same-sign floating-point adders,
   wherein the multiplexing logic is configured to:
      evaluate at least a sign bit of each floating-point number of the at least three floating-point numbers;
      pass each floating-point number of the at least three floating-point numbers to a respective input of the first array only if the sign bit of that floating-point number is zero; and
      pass each floating-point number of the at least three floating-point numbers to a respective input of the second array only if the sign bit of that floating-point number is one,
   the adder circuit further comprising a floating-point subtractor or mixed-sign floating-point adder, configured to combine an output of the second array with an output of the first array.

6. The adder circuit of claim 5, wherein each of the first array and the second array comprises a logarithmic tree of same-sign floating-point adders.

7. The adder circuit of claim 5, wherein the first array and the second array are two different physical arrays in hardware.

8. The adder circuit of claim 5, wherein the first array and the second array are provided by a single physical array in hardware,
   wherein the multiplexing logic is configured to:
      pass floating-point numbers whose sign bit is zero to the single array in a first time interval; and
      pass floating-point numbers whose sign bit is one to the single array in a second, different time interval.

9. The adder circuit of claim 1, wherein the multiplexing logic is configured to sort the at least three floating-point numbers into positive numbers and negative numbers.

10. The adder circuit of claim 9, wherein the one or more same-sign floating-point adders comprises an array of same-sign floating-point adders, the array having a plurality of inputs,
    wherein the multiplexing logic comprises a rotating multiplexer, configured to align a boundary between the positive numbers and negative numbers with a boundary between two same-sign floating-point adders in the array, such that each same-sign floating-point adder in the array receives inputs that have the same sign.

11. An integrated circuit manufacturing system comprising:
    a non-transitory computer readable storage medium having stored thereon a computer readable dataset description of an adder circuit as set forth in claim 1;
    a layout processing system configured to process the computer readable description so as to generate a circuit layout description of an integrated circuit embodying the adder circuit; and
    an integrated circuit generation system configured to manufacture the adder circuit according to the circuit layout description.

12. A machine-implemented method of processing at least three floating-point numbers (A, B, C, . . . N) to be summed, the at least three floating-point numbers including one or more positive numbers and one or more negative numbers, the method comprising:

identifying at least two numbers of the at least three floating-point numbers that have the same sign; and adding together the identified at least two numbers using one or more same-sign floating-point adders, to produce one or more partial summation results.

13. The method of claim 12, further comprising:

adding together the one or more partial summation results and each remaining number from the at least three floating-point numbers, thereby calculating the sum of the at least three floating-point numbers, wherein said adding together comprises using at least one mixed-sign floating-point adder implemented in fixed function circuitry configured to add together floating-point numbers having signs that are the same or different.

14. The method of claim 12, further comprising:

using a mixed-sign floating-point adder to add together a plurality of numbers derived from the at least three floating-point numbers, wherein at least one of the plurality of numbers is a partial summation result produced by a same-sign floating-point adder, thereby calculating the sum of the at least three floating-point numbers, wherein the mixed-sign floating-point adder is implemented in fixed function circuitry configured to add together floating-point numbers having signs that are the same or different.

15. The method of claim 12, wherein the one or more same-sign floating-point adders comprises a first array of same-sign floating-point adders and a second array of same-sign floating-point adders, wherein identifying the at least two numbers having the same sign comprises:

evaluating at least a sign bit of each floating-point number of the at least three floating-point numbers;

passing each floating-point number of the at least three floating-point numbers to a respective input of the first array only if the sign bit of that floating-point number is zero; and passing each floating-point number of the at least three floating-point numbers to a respective input of the second array only if the sign bit of that floating-point number is one, the method further comprising combining an output of the second array with an output of the first array.

16. The method of claim 15, wherein the first array and the second array are implemented by two different arrays.

17. The method of claim 15, wherein the first array and the second array are implemented by a single array, which is operated as the first array at a first time and is operated as the second array at a second, different time.

18. The method of claim 12, wherein identifying the at least two numbers having the same sign comprises sorting the at least three floating-point numbers into positive numbers and negative numbers, wherein the one or more same-sign floating-point adders optionally comprises an array of same-sign floating-point adders, the array having a plurality of inputs, and wherein adding together the identified at least two numbers optionally comprises:

passing some or all of the positive numbers to a respective first subset of the plurality of inputs; and passing some or all of the negative numbers to a respective second subset of the plurality of inputs, such that each same-sign floating-point adder in the array receives inputs that have the same sign.

19. The method of claim 12 wherein identifying the at least two numbers that have the same sign comprises determining that more than two numbers have the same sign, and identifying, among the more than two numbers having the same sign, the at least two numbers that have the smallest absolute values.

* * * * *